US008873341B2

(12) United States Patent
Lebental et al.

(10) Patent No.: US 8,873,341 B2

(45) Date of Patent: Oct. 28, 2014

(54) CMUT CELL FORMED FROM A MEMBRANE OF NANOTUBES OR NANOWIRES OR NANORODS AND DEVICE FOR ULTRA HIGH FREQUENCY ACOUSTIC IMAGING INCLUDING MULTIPLE CELLS OF THIS KIND

(75) Inventors: Berengere Lebental, Levallois Perret (FR); Anne Ghis, Saing Martin d'Heres (FR)

(73) Assignees: Commissariat a l'energie Atomique et aux Energies Alternatives, Paris (FR); Laboratoire Central des Ponts et Chaussees, Paris (FR); Ecole Nationale des Ponts et Chaussees, Marne la Vallee (FR)

(*) Notice: Subject to any disclaimer, the term of this patent is extended or adjusted under 35 U.S.C. 154(b) by 390 days.

(21) Appl. No.: 13/130,397

(22) PCT Filed: Nov. 20, 2009

(86) PCT No.: PCT/EP2009/065582

§ 371 (c)(1), (2), (4) Date: May 20, 2011

(87) PCT Pub. No.: WO2010/057992

PCT Pub. Date: May 27, 2010

(65) Prior Publication Data

US 2011/0242932 A1 Oct. 6, 2011

(30) Foreign Application Priority Data

Nov. 21, 2008 (FR) .................................... 08 57928

(51) Int. Cl.

| | |
|---|---|
| ***B06B 1/02*** | (2006.01) |
| ***B60B 1/02*** | (2006.01) |
| ***B81C 1/00*** | (2006.01) |
| ***H01L 29/16*** | (2006.01) |

(52) U.S. Cl.

CPC .......... *B60B 1/0292* (2013.01); *B81C 1/00158* (2013.01); *B81B 2201/0257* (2013.01); *H01L 29/1606* (2013.01); *B81B 2203/0127* (2013.01)

USPC ........................................................ 367/181

(58) Field of Classification Search

None

See application file for complete search history.

(56) References Cited

U.S. PATENT DOCUMENTS 6,803,840 B2 * 10/2004 Kowalcyk et al. ............ 333/186
7,253,434 B2 8/2007 Golovchenko et al.

(Continued)

FOREIGN PATENT DOCUMENTS

EP 1 414 739 B1 10/2006
FR 2 880 232 A1 6/2006

(Continued)

OTHER PUBLICATIONS

Igal Ladabaum, et al., "Surface Micromachined Capacitive Ultrasonic Transducers", IEEE Transactions on Ultrasonics, Ferroelectrics, and Frequency Control, vol. 45, No. 3, May 1998, pp. 678-690.

(Continued)

*Primary Examiner* — Isam Alsomiri

*Assistant Examiner* — Hovhannes Baghdasaryan

(74) *Attorney, Agent, or Firm* — Oblon, Spivak, McClelland, Maier & Neustadt, L.L.P.

(57) ABSTRACT

A cMUT-type capacitive electroacoustic transducer including: at least one membrane configured to oscillate under effect of an electric field and/or an acoustic wave, wherein the membrane is formed from one or more layers of juxtaposed nanotubes or nanowires or nanorods, and an acoustic imaging device or UHF sonar including such transducers.

15 Claims, 10 Drawing Sheets

(56) References Cited

U.S. PATENT DOCUMENTS

Figure 1A:
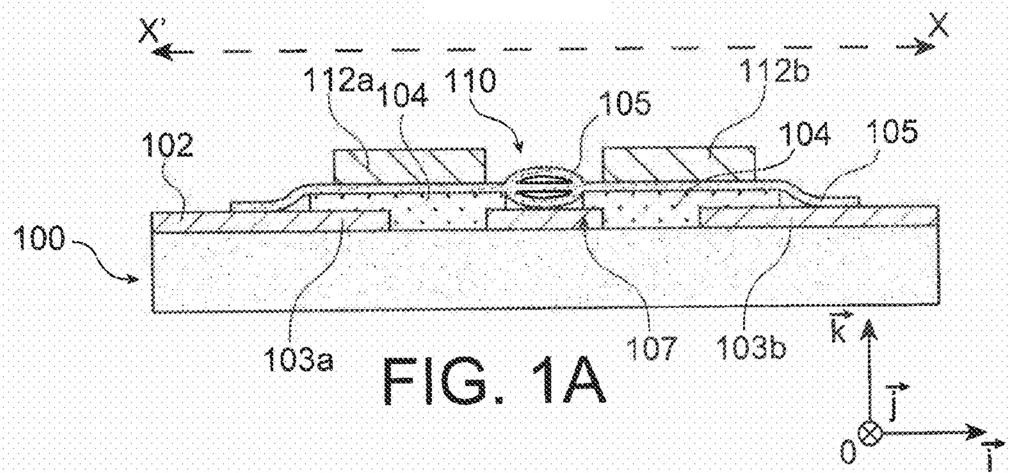

| | | | | |
|---|---|---|---|---|
| 7,723,684 | B1 * | 5/2010 | Haddon et al. | 250/338.1 |
| 7,799,163 | B1 * | 9/2010 | Mau et al. | 156/247 |
| 8,345,513 | B2 * | 1/2013 | Huang | 367/181 |
| 2005/0218398 | A1 * | 10/2005 | Tran | 257/14 |
| 2005/0249656 | A1 * | 11/2005 | Smalley et al. | 423/447.3 |
| 2006/0006377 | A1 * | 1/2006 | Golovchenko et al. | 257/39 |
| 2006/0040318 | A1 * | 2/2006 | Melker et al. | 435/7.1 |
| 2006/0055392 | A1 * | 3/2006 | Passmore et al. | 324/71.1 |
| 2006/0102871 | A1 * | 5/2006 | Wang et al. | 252/62.51 R |
| 2006/0116585 | A1 | 6/2006 | Nguyen-Dinh et al. | |
| 2006/0145326 | A1 * | 7/2006 | Tran | 257/680 |
| 2006/0147081 | A1 * | 7/2006 | Mango et al. | 381/398 |
| 2006/0170014 | A1 | 8/2006 | Smith et al. | |
| 2006/0249402 | A1 | 11/2006 | Snow et al. | |
| 2006/0257883 | A1 * | 11/2006 | Bjoraker et al. | 435/6 |
| 2006/0263255 | A1 * | 11/2006 | Han et al. | 422/83 |
| 2007/0017345 | A1 * | 1/2007 | Stoneback | 84/600 |
| 2007/0045756 | A1 * | 3/2007 | Chang et al. | 257/414 |
| 2007/0046396 | A1 * | 3/2007 | Huang | 333/186 |
| 2007/0081681 | A1 * | 4/2007 | Yu et al. | 381/190 |
| 2007/0161896 | A1 | 7/2007 | Adachi et al. | |
| 2007/0214940 | A1 * | 9/2007 | Stoneback | 84/600 |
| 2007/0215964 | A1 | 9/2007 | Khuri-Yakub et al. | |
| 2008/0089830 | A1 * | 4/2008 | Smalley et al. | 423/461 |
| 2008/0170982 | A1 * | 7/2008 | Zhang et al. | 423/447.3 |
| 2008/0194053 | A1 * | 8/2008 | Huang | 438/53 |
| 2008/0260188 | A1 | 10/2008 | Kim | |
| 2008/0314149 | A1 * | 12/2008 | Rueger | 73/579 |
| 2009/0013792 | A1 * | 1/2009 | Qiao et al. | 73/723 |
| 2009/0198117 | A1 * | 8/2009 | Cooper et al. | 600/347 |
| 2009/0268556 | A1 * | 10/2009 | Jiang et al. | 367/140 |
| 2009/0268557 | A1 * | 10/2009 | Jiang et al. | 367/140 |
| 2009/0268558 | A1 * | 10/2009 | Jiang et al. | 367/140 |
| 2009/0268559 | A1 * | 10/2009 | Jiang et al. | 367/140 |
| 2009/0268560 | A1 * | 10/2009 | Jiang et al. | 367/140 |
| 2009/0268561 | A1 * | 10/2009 | Jiang et al. | 367/140 |
| 2009/0268562 | A1 * | 10/2009 | Jiang et al. | 367/140 |
| 2009/0274008 | A1 * | 11/2009 | Jiang et al. | 367/140 |
| 2009/0274009 | A1 * | 11/2009 | Jiang et al. | 367/140 |
| 2009/0279390 | A1 * | 11/2009 | Jiang et al. | 367/140 |
| 2009/0296528 | A1 * | 12/2009 | Jiang et al. | 367/140 |
| 2009/0323475 | A1 * | 12/2009 | Jiang et al. | 367/140 |
| 2009/0323476 | A1 * | 12/2009 | Jiang et al. | 367/140 |
| 2010/0046774 | A1 * | 2/2010 | Feng et al. | 381/164 |
| 2010/0054503 | A1 * | 3/2010 | Jiang et al. | 381/164 |
| 2010/0054504 | A1 * | 3/2010 | Jiang et al. | 381/164 |
| 2010/0086150 | A1 * | 4/2010 | Jiang et al. | 381/164 |
| 2010/0098272 | A1 * | 4/2010 | Jiang et al. | 381/164 |
| 2010/0098273 | A1 * | 4/2010 | Jiang et al. | 381/164 |
| 2010/0110839 | A1 * | 5/2010 | Jiang et al. | 367/140 |

FOREIGN PATENT DOCUMENTS

| | | | |
|---|---|---|---|
| FR | 2 897 051 | A1 | 8/2007 |
| JP | 2003-319490 | | 11/2003 |
| JP | 2005-510264 | | 4/2005 |
| JP | 2005-341143 | | 12/2005 |
| JP | 2006-50314 | | 2/2006 |
| JP | 2006-186999 | | 7/2006 |
| JP | 2007-136856 | | 6/2007 |
| JP | 2008-504574 | | 2/2008 |
| JP | 2009-528254 | | 8/2009 |
| WO | WO 03/011749 | A2 | 2/2003 |
| WO | WO 2005/102924 | A1 | 11/2005 |
| WO | WO 2006/002388 | A1 | 1/2006 |
| WO | WO 2007/030423 | A2 | 3/2007 |
| WO | WO 2007/052928 | A1 | 5/2007 |
| WO | WO 2007/126412 | A2 | 11/2007 |

OTHER PUBLICATIONS

L.L.Liu, et al., "A Novel Method for Fabricating Capacitive Micromachined Ultrasonic Transducers with Ultra-Thin Membranes", 2004 IEEE Ultrasonic Symposium, Ferroelectrics, and Frequency Control Joint 50th Anniversary Conference, 2004, pp. 497-500.

E. Colinet, et al., "Measurement of Nano-Displacement Based on In-Plane Suspended-Gate MOSFET Detection Compatible with a Front-End CMOS Process", 2008 IEEE International Solid-State Circuits Conference, Session 18, MOS Medley, 18.2, pp. 5-7.

Yeji Kim, et al., "Langmuir—Blodgett Films of Single-Wall Carbon Nanotubes: Layer-by-layer Deposition and In-plane Orientation of Tubes", 2003 The Japan Society of Applied Physics, vol. 42, 2003, pp. 7629-7634.

Maria Dimaki, et al., "Frequency Dependence of the Structure and Electrical Behaviour of Carbon Nanotube Networks Assembled by Dielectrophoresis", Nanotechnology 16 , 2005, pp. 759-763.

Sasha Stankovich, et al., "Synthesis of Graphene-based Nanosheets via Chemical Reduction of Exfoliated Graphite Oxide", Science Direct, Carbon 45, 2007, pp. 1558-1565.

B. Lebental, "Micro-Transducteur Ultrasonique à Base de Nanotubes de Carbone Pour l'instrumentation Immergée des Matériaux Cimentaires", 19éme Congrés Français de Mécanique, Marseille, Aug. 24-28, 2009, pp. 1-6 (with English abstract).

J. Scott Bunch, et al., "Electromechanical Resonators from Graphene Sheets", Science, vol. 315, (490), Jan. 26, 2007, DOI:10.1126/science.1136836, pp. 490-493.

Preliminary Search Report issued Jun. 12, 2009, in France Patent Application No. FR 0857928 FA 716889 (with English Translation of Category of Cited Documents) Additional References sheet(s) attached.

International Preliminary Report on Patentability issued Jun. 23, 2011 in PCT/EP2009/065582 (with Translation).

Office Action issued Mar. 31, 2014, in Japanese Patent Application No. 2011-536880 (English-language Translation only).

U.S. Appl. No. 13/130,492, filed May 20, 2011, Lebental et al.

* cited by examiner

CMUT CELL FORMED FROM A MEMBRANE OF NANOTUBES OR NANOWIRES OR NANORODS AND DEVICE FOR ULTRA HIGH FREQUENCY ACOUSTIC IMAGING INCLUDING MULTIPLE CELLS OF THIS KIND

TECHNICAL FIELD

The invention concerns the field of micro-manufactured electroacoustic transducers of the capacitive kind also called "cMUT", and proposes a device fitted with one or more cMUT transducers including an improved membrane.

The invention makes improvements in particular in terms of rigidity and thickness of the membrane, of the extent of the device's operating frequency range, and of bandwidth.

It applies notably to the field of high-frequency acoustic imaging.

STATE OF THE PRIOR ART

Devices for generating and detecting ultrasonic acoustic waves can include micro-manufactured ultrasonic transducers, i.e. devices capable of converting acoustic energy into electrical energy, and vice versa, and which are manufactured by means of technologies for manufacturing thin layers of microsystems or micro-devices.

Several types of transducer are distinguished:

pMUT transducers (pMUT for "piezoelectric MUT") which are formed from piezoelectric elements.

mMUT transducers (mMUT for "Magnetostrictive" MUT), the operating principle of which is based on magnetostriction.

cMUT transducers (capacitive MUT), which use electrostatic force.

To generate acoustic waves in solid media ultrasonic transducers produced from piezoelectric ceramics (pMUTs) are particularly suitable, since their acoustic impedance is generally of the same order of magnitude as that of the solid materials in which the waves are generated. Conversely, the use of pMUT transducers in fluid media poses problems of impedance mismatch.

To address this problem transducers with piezoelectric composites can be used. In these transducers impedance match layers, such as quarter wave layers, are added to the piezoelectric ceramic material of the transducer. This has the disadvantage that it makes the manufacture of such transducers more complex.

An alternative to pMUT transducers is the use of cMUT transducers, operation of which is based on the electrostatic effect.

Such transducers can be formed from an electro-plated membrane positioned above a metal plate acting as an electrode, and can be designed to emit ultrasounds, for example in air or in water.

The operation of these transducers is based on an electrostatic attraction between a membrane and a metal plate when a voltage is applied to this plate. In wave reception mode the vibrations of the membrane caused by the acoustic waves can be measured by a variation of capacity, or by a strain gauge.

One of the main advantages of cMUTs is their low acoustic impedance, which therefore makes them suitable for use in a fluid medium.

Ultrasonic transducers can be arranged in a matrix to form an acoustic imaging device, as has been described, for example, in document EP 1 414 739 B1.

cMUT transducers are generally formed from a membrane with a silicon nitride base covered with gold, and positioned in the rear face of a doped silicon plate.

In the document: *Surface Micromachined Capacitive Ultrasonic Transducers*, I. Ladabaum, IEEE Trans. on Ultrasonics, Ferroelectrics and frequency control, Vol 45 N°3, 1998, an example of such a cMUT transducer is given.

In the document: *A novel method for fabricating capacitive micromachined ultrasonic transducers with ultrathin membranes*, L. L. Liu, in 2004 IEEE International Ultrasonics, Ferroelectrics, and Frequency Control Joint $50^{th}$ Anniversary Conference, p. 497, an example embodiment of a cMUT transducer with a membrane made of alumina is also given.

The production of cMUT transducers by micro-machining also generally includes a step of release of a membrane.

A method consisting in structuring a sacrificial layer before depositing the membrane over it, creating holes in the membrane in order to be able to remove the sacrificial layer, and then in sealing the holes after releasing the membrane, is given for example in document US 2007/0161896 A1.

Another method consists in depositing an independently produced membrane on a structured substrate.

The production of cMUTs of small size is therefore difficult to implement since the existing deposit methods do not enable membranes with a sufficiently high form factor to be produced, since the membranes are generally formed too thick for too small an area.

The release methods also tend to embrittle the membranes.

Furthermore, the cMUT transducers obtained using such methods have a limited range of accessible frequencies, for example 20 kHz to 10 MHz.

A cMUT transducer including layers of strain-reducing materials has been disclosed in document FR 2 880 232(A1).

Document US 2007/0215964 A1, for its part, discloses a cMUT transducer with a membrane including secondary structures which, among other functions, enable the mass and rigidity of the membrane to be varied independently, leading to an improved sensitivity of the device.

Such a device poses problems in relation to the complexity of its use, its cost of manufacture, its encumbrance, and the operating frequencies which can be accessed.

In patent US 2006/0116585(A1) a device formed from a stack of layers in which emission and reception are uncoupled is proposed.

The bandwidth and efficiency of the transducer are increased by this method. Such a device poses problems notably in terms of complexity of use, and cost of production.

The problem of finding a new device with a cMUT transducer making improvements compared to the disadvantages mentioned above is posed.

ACCOUNT OF THE INVENTION

The invention uses a capacitive electroacoustic transducers cell of the cMUT type including one or more membranes formed respectively from a layer or from several layers of nanotubes and/or nanowires and/or nanorods.

By "nanowires" or "nanorods", or "nanotubes", it is meant, here, elements in the form of bars, having a critical dimension or a diameter (in the case of the nanowires and nanotubes) which can be between 0.5 nm and 5 μm.

Nanowires can be cylindrical or roughly cylindrical in shape, with a rounded profile.

Nanorods can be parallelepipedic or roughly parallelepipedic in shape.

"Nanotubes" is intended to mean bars, having a hollow central part, and having a diameter which may be between 0.5 nm and 5 μm.

The length of the nanowires or of the nanorods or of the nanotubes can be between, for example, 50 nm and 1 mm.

The invention thus allows for a cMUT-type capacitive electroacoustic transducer including: at least one membrane designed to oscillate under the effect of an electric field and/or an acoustic wave, where the membrane is formed from one or more layers formed of juxtaposed nanotubes, and/or juxtaposed nanowires and/or nanorods.

The membrane may be formed from at least one layer of mutually parallel nanotubes and/or nanowires and/or nanorods.

The assembly of nanotubes and/or nanowires and/or nanorods in a membrane enables the transducer of the invention to benefit from the performance characteristics of the NEMS resonators to accomplish the actuation function of an ultrasonic transducer, whilst being miniature and rigid. In other words, the transducer according to the invention is small in size and has high working frequencies.

According to one possible implementation, the device may include one or more membranes each formed from one or more layers of parallel nanotubes and/or nanowires and/or nanorods separated by a distance of the order of the equilibrium distance of the van der Waals interaction.

This membrane may be positioned above at least one cavity and may be designed to oscillate under the effect of the electric field when the device is in emission mode.

The membrane may be designed to oscillate under the effect of acoustic wave, when the device is in reception mode.

Such a device enables high-frequency waves to be generated and detected, particularly in a fluid medium with, possibly, one or more gradients of physical properties, and possibly having solid inclusions, and possibly irregular edges.

According to one possibility, the membrane may include one or more "connection" layers, attached to nanotubes and/or nanowires and/or nanorods.

According to another possibility the membrane may also be formed: from one or more "connection" layers, attached to nanotubes and/or nanowires and/or nanorods.

Such layers may be designed to enable the nanowires, nanotubes and/or nanorods to be connected, and/or to seal the membrane.

The base of the connection layer or layers can be a material chosen to be more deformable than the layer or layers of nanotubes and/or nanowires and/or nanorods of the membrane.

The membrane may include:

- one or more layers of nanotubes or nanowires or nanorods of a first size, in particular of a first critical dimension,
- one or more layers of nanotubes or nanowires or nanorods of a second size, different from the first size, in particular of a second critical dimension different from the first critical dimension.

This may, for example, enable the bandwidth to be increased, the operating frequency to be modulated, or the emission and reception frequencies to be uncoupled.

According to a possible implementation, the membrane may be formed from at least a first layer of nanotubes and/or nanowires and/or nanorods aligned in a first direction, and at least a second layer of nanotubes and/or nanowires and/or nanorods aligned in a second direction, which is orthogonal to the first direction.

According to a particular implementation, the membrane may be formed from one or more layers of nanotubes, and/or nanowires and/or nanorods.

In this case, according to one possibility, the membrane may include at least one connection layer with a graphene base, attached to at least one layer of nanotubes, and/or nanorods and/or nanowires.

The fact of covering the membrane formed by the layer or layers of nanotubes, nanowires or nanorods enables the impermeability of the membrane and a degree of actuation efficiency to be guaranteed, without its mechanical properties.

According to another possibility, the membrane may be formed from one or more layers of nanotubes, and/or layer(s) of nanorods and/or layer(s) of nanowires, inserted between at least a first layer of graphene and at least a second layer of graphene.

According to a particular implementation, the membrane may be formed from a self-supporting core consisting solely of nanowires and/or nanorods and/or nanotubes.

The capacitive electroacoustic transducer can also include: at least one actuation and/or detection electrode, and at least one cavity above which the membrane is intended to oscillate, where the membrane is positioned facing said cavity.

The capacitive electroacoustic transducer can also include:

- means to apply a fixed potential to said electrode,
- means to apply a variable potential to said electrode.

In this case the transducer can be designed to operate as an emitter or as an emitter/receiver.

The capacitive electroacoustic transducer can include:

- means to apply a fixed potential to said electrode,
- means forming a capacitance meter.

In this case the transducer can be designed to operate as a receiver or as an emitter/receiver.

According to a possible implementation, the capacitive electroacoustic transducer can also include:

- at least one first electrode, and at least one first cavity above which a membrane is intended to oscillate, where the membrane is positioned facing said first cavity,
- at least one second electrode, and at least one second cavity in which a membrane facing said second electrode and said second cavity is intended to oscillate.

According to a possible implementation the first cavity can be, for example, intended to form an emitting part of the device, whereas the second cavity can be, for example, intended to form the receiving part of the device.

According to a possible implementation of the transducer, the same membrane can be positioned facing the first cavity and the second cavity.

According to a possible implementation, the transducer can include multiple membranes positioned above the same cavity.

According to a possible implementation, the transducer can include a membrane positioned above several cavities or a matrix of cavities.

The transducer can include several membranes positioned above or facing the same cavity.

The invention also concerns a UHF acoustic or sonar imaging device including a matrix of cMUT-type capacitive electroacoustic transducers as defined above.

BRIEF DESCRIPTION OF THE ILLUSTRATIONS

Figure 1B:
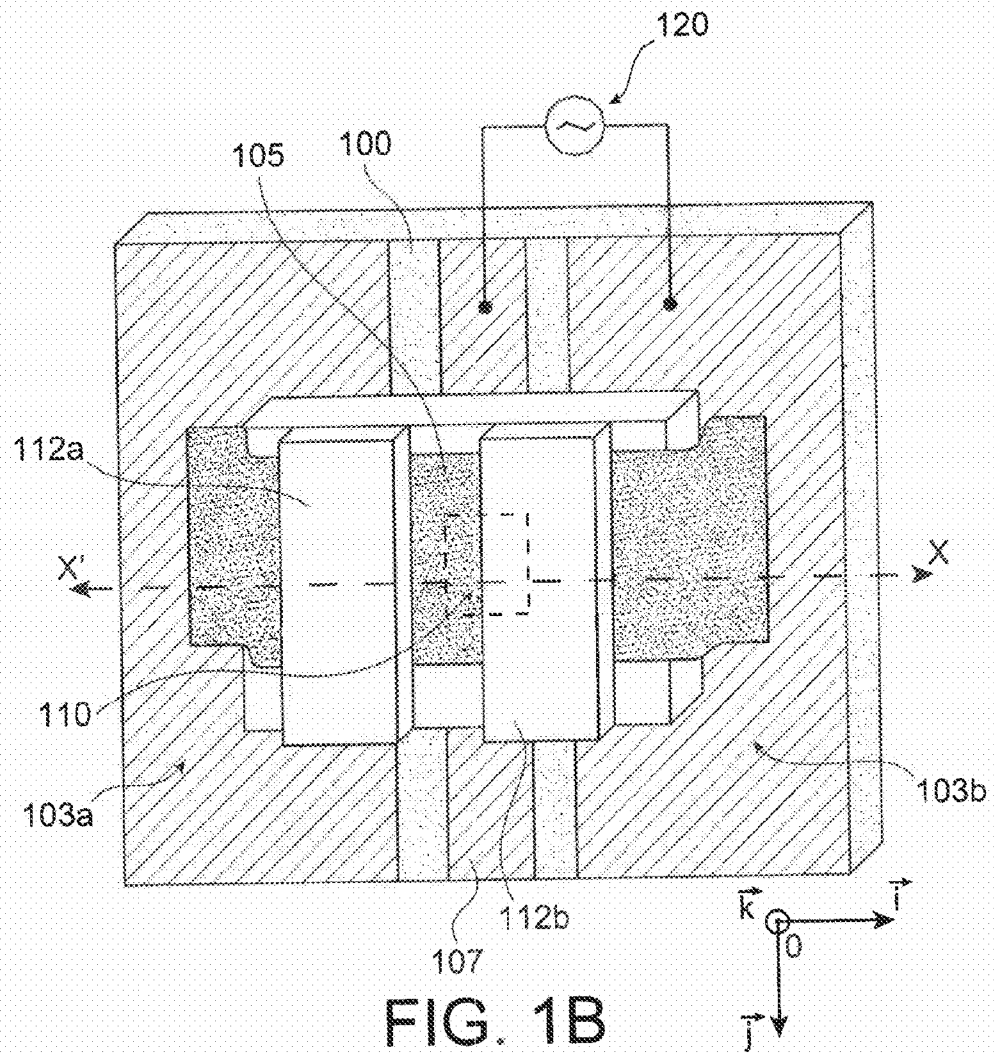
Figure 2A:
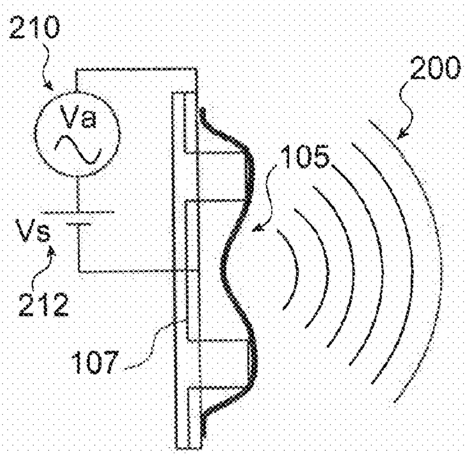
Figure 2B:
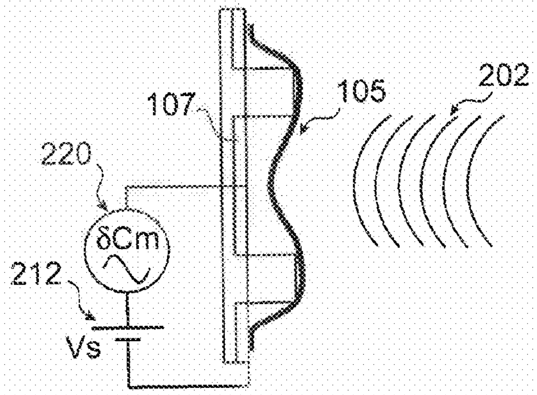
Figure 2C:
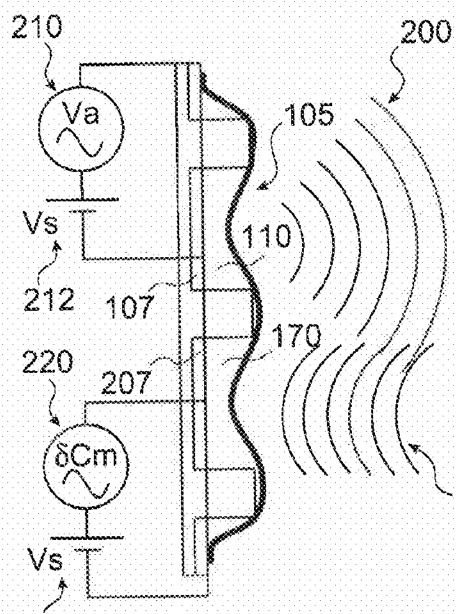
Figure 2D:
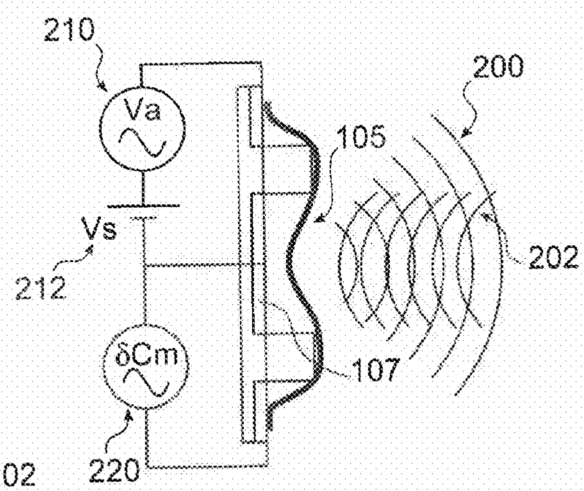
Figure 2E:
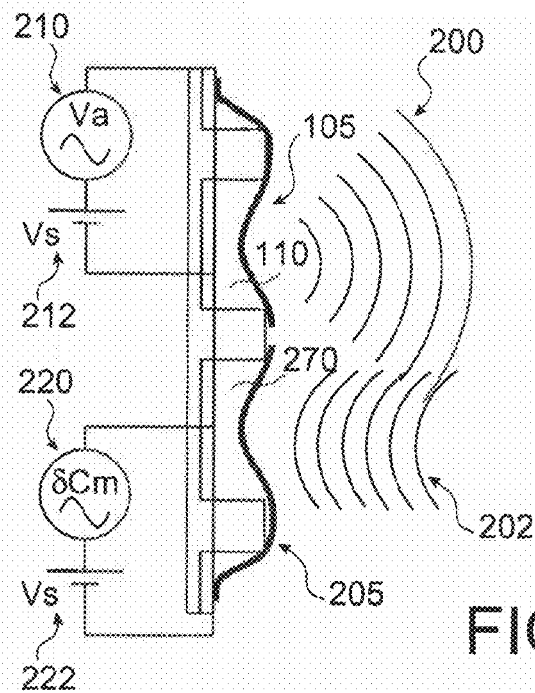
Figure 3:
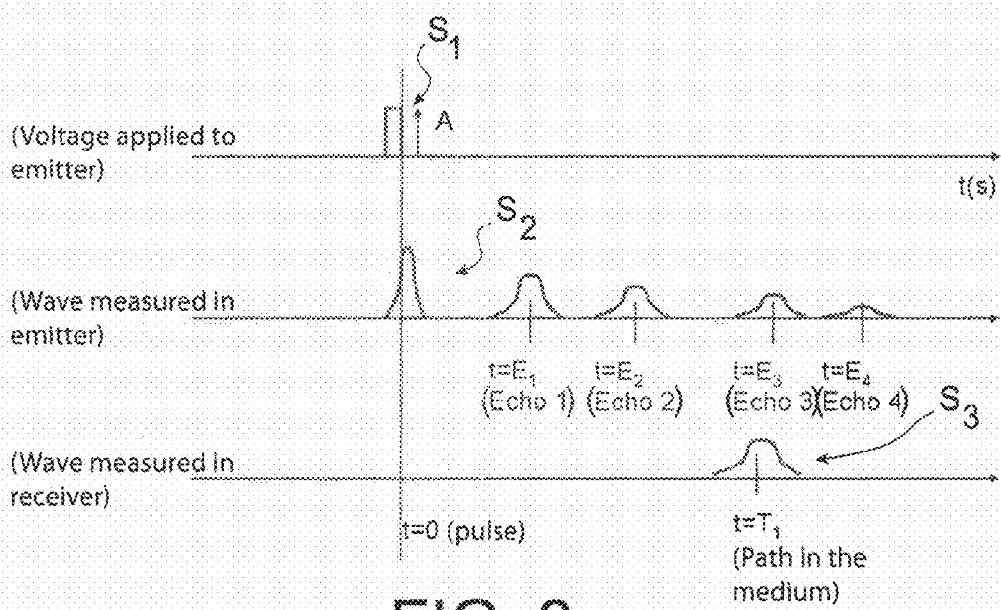
Figure 4:
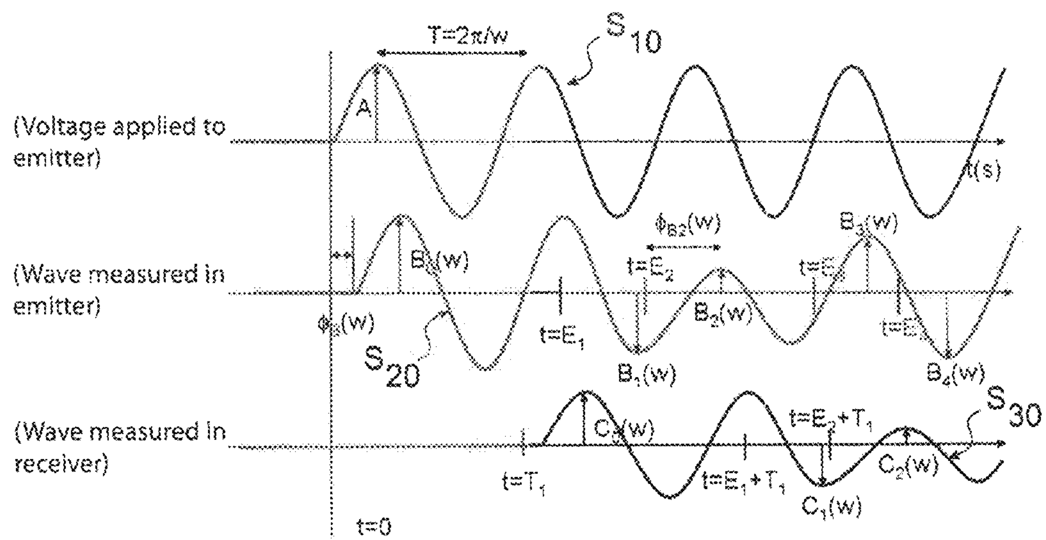
Figure 5:
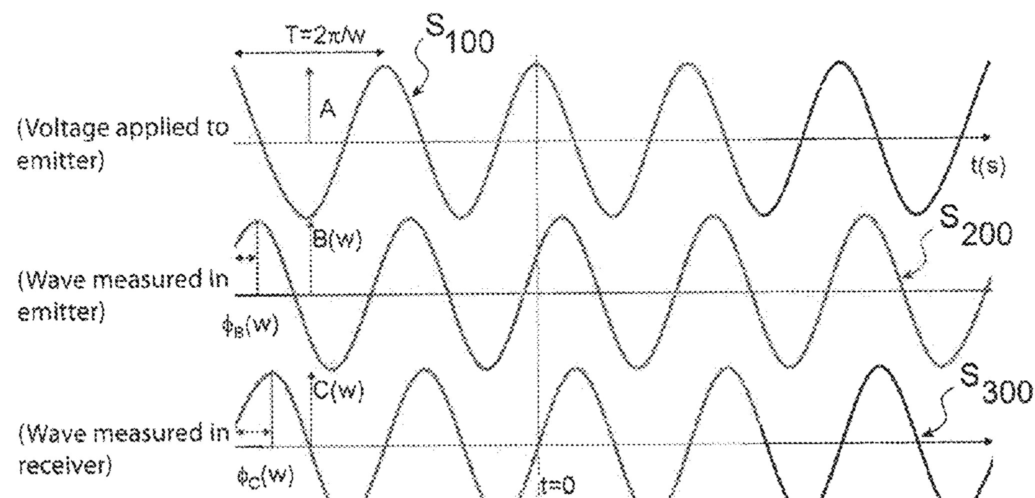
Figure 6A:
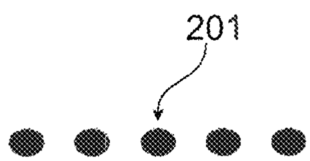
Figure 7A:
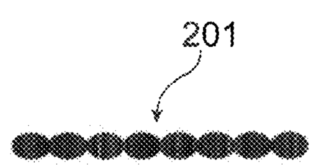
Figure 6B:
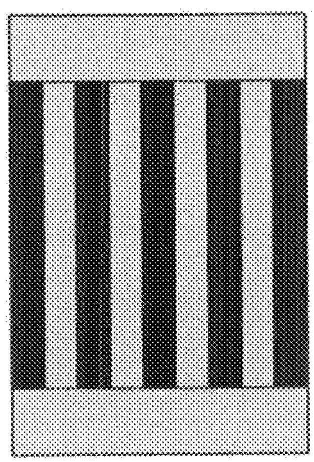
Figure 7B:
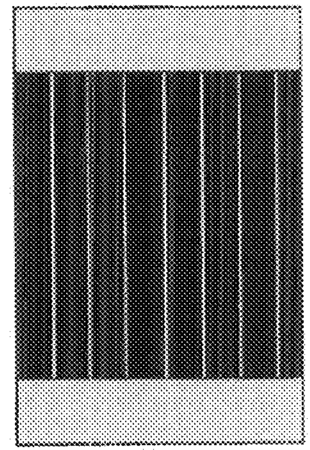
Figure 8A:
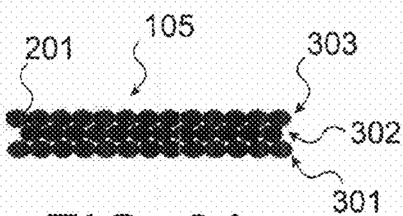
Figure 8B:
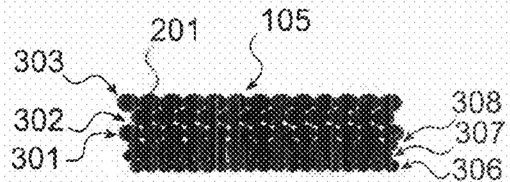
Figure 8C:
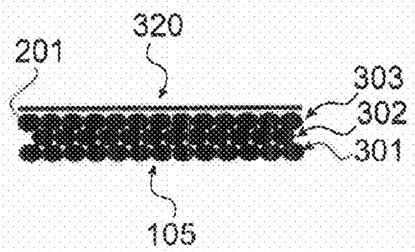
Figure 8D:
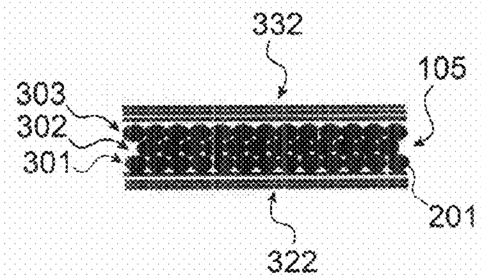
Figure 9A:
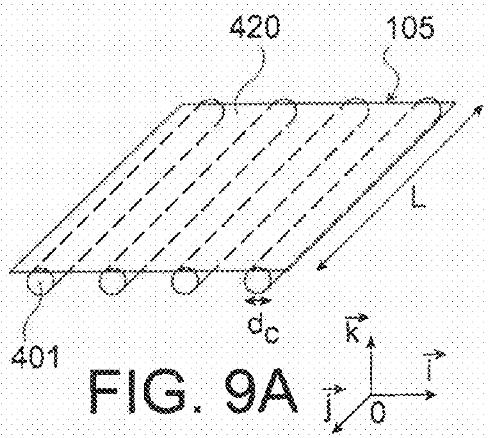
Figure 9B:
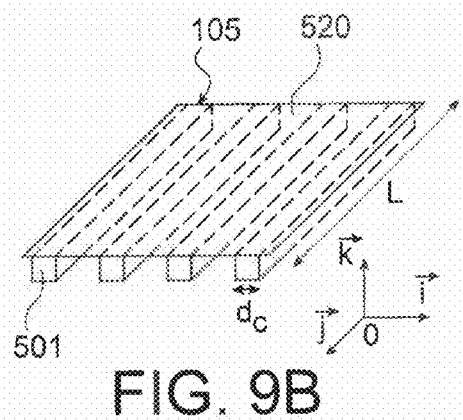
Figure 9C:
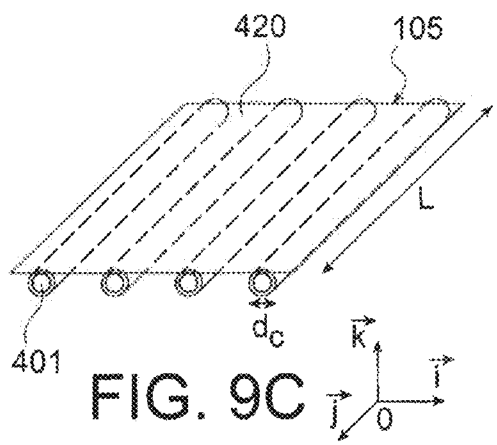
Figure 9D:
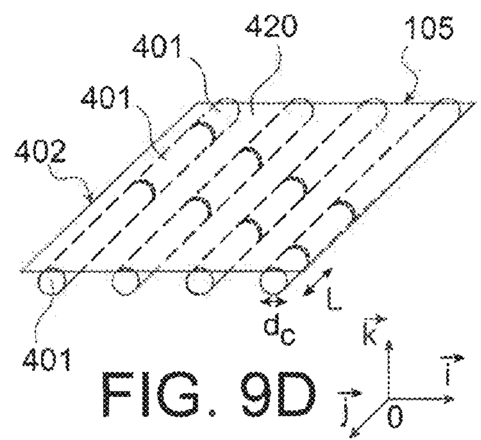
Figure 9E:
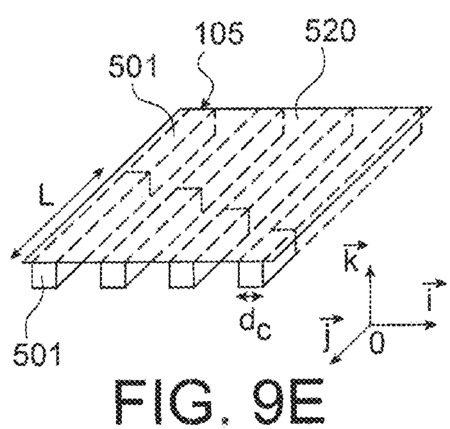
Figure 9F:
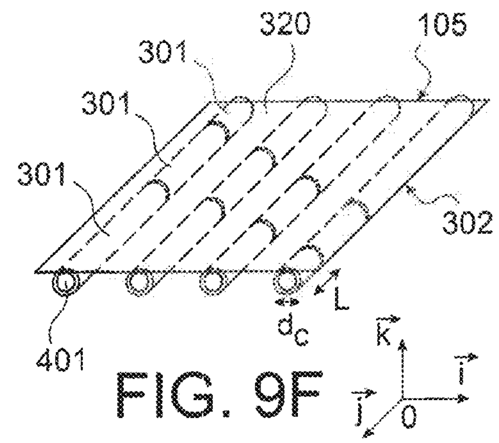
Figure 10A:
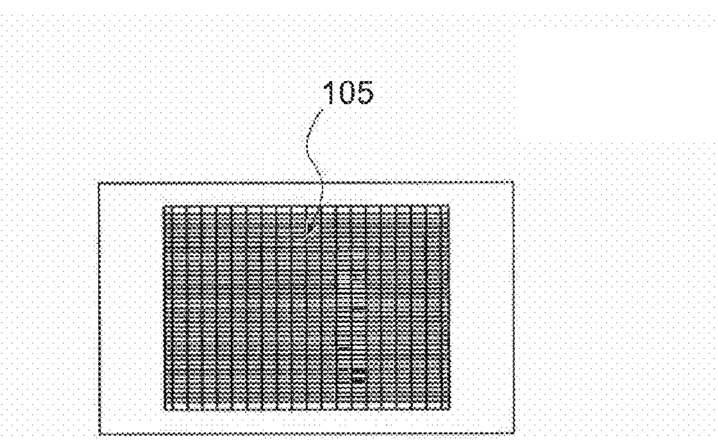
Figure 10B:
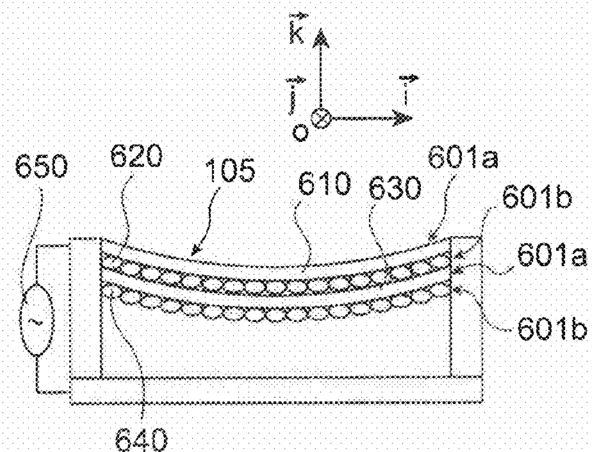
Figure 11A:
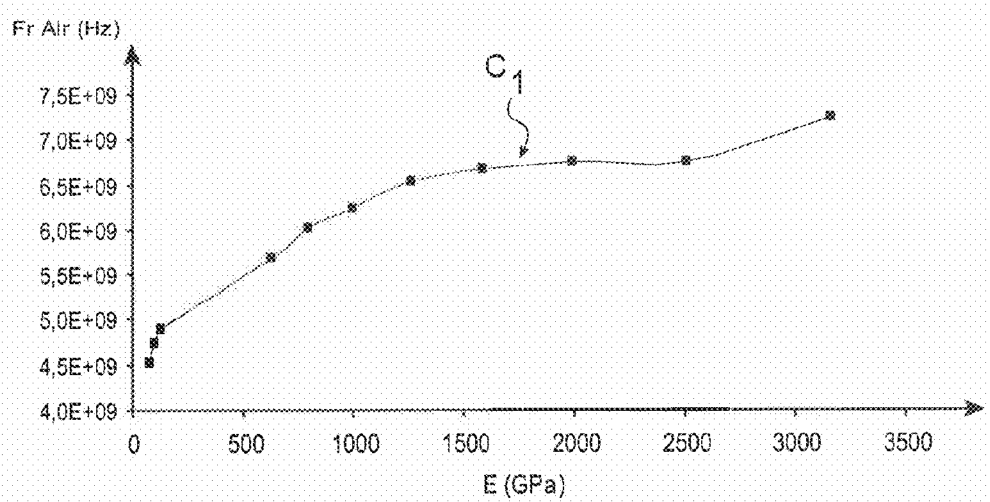
Figure 11B:
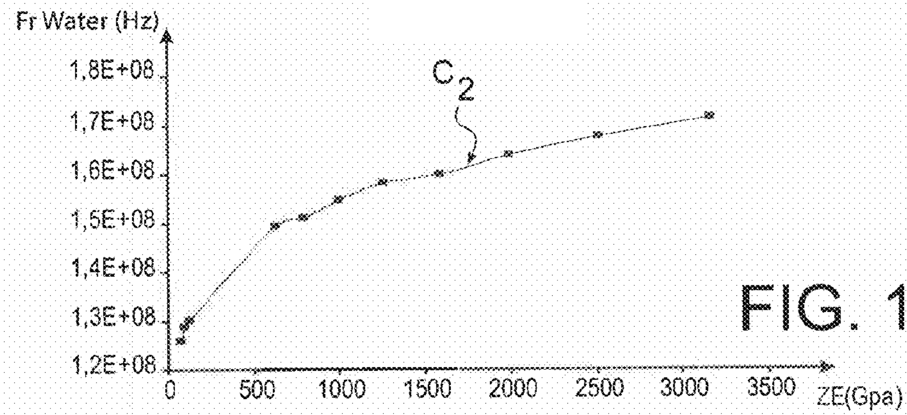
Figure 12A:
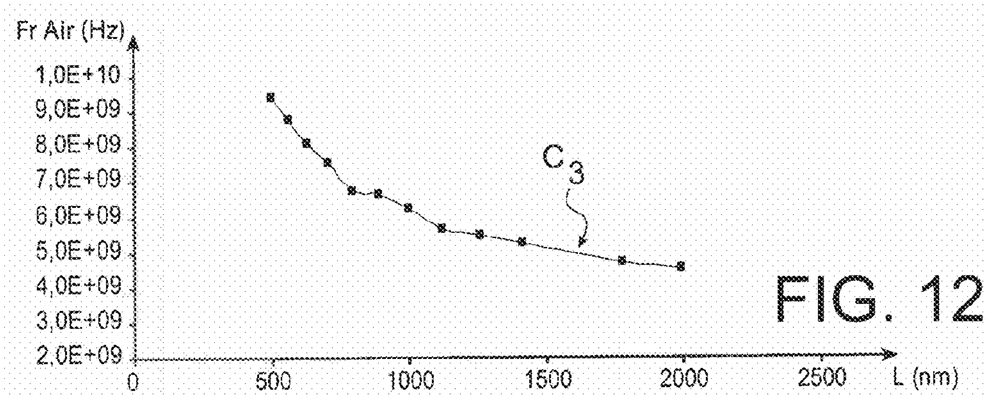
Figure 12B:
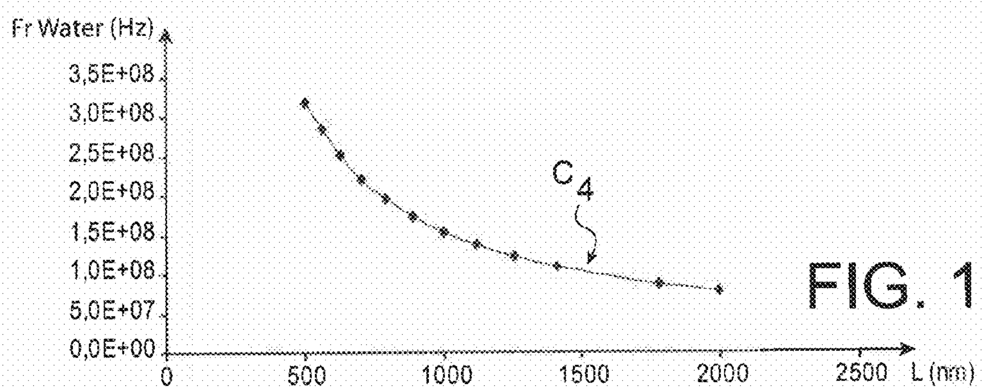
Figure 13:
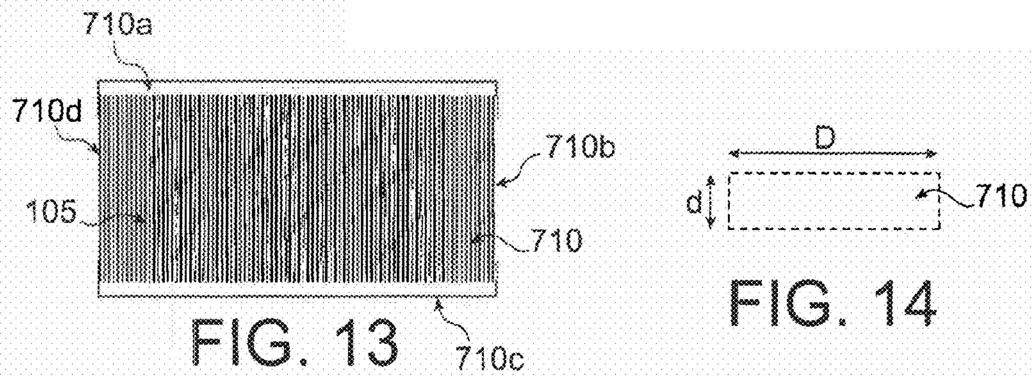
Figure 15:
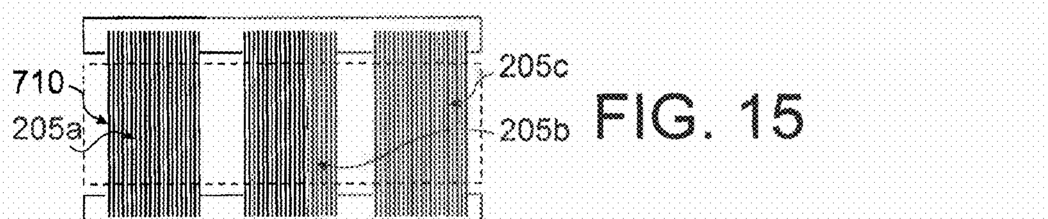
Figure 16:
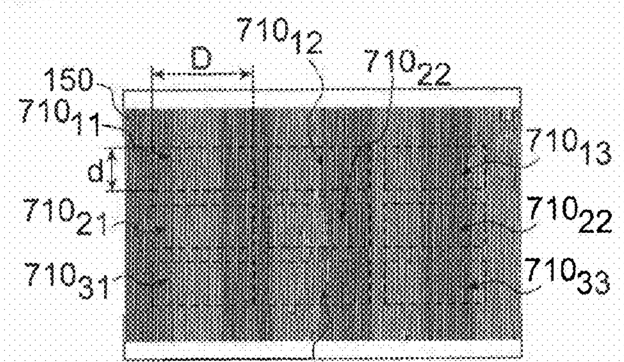
Figure 17:
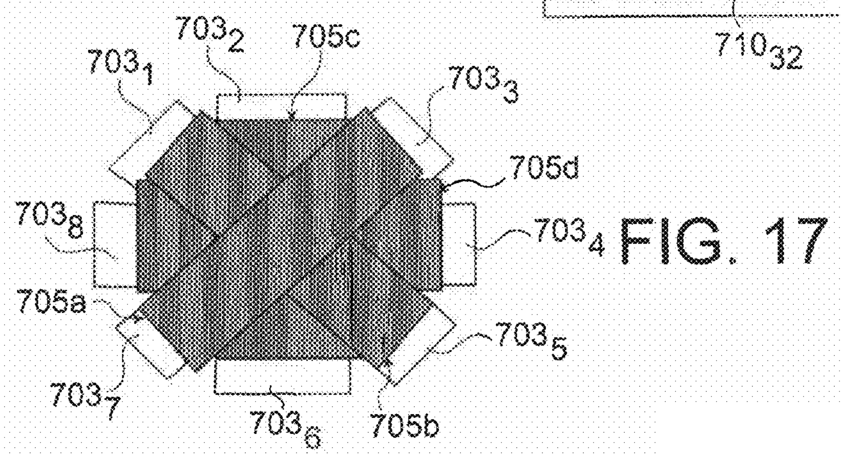

The present invention will be better understood on reading the description of examples of embodiment given, purely as an indication and in no way limiting, making reference to the annexed illustrations in which:

FIGS. 1A and 1B illustrate an example of a cMUT transducer according to the invention, including a membrane formed of nanotubes or nanowires or nanorods, according to a top view and according to a transverse section view, FIGS. 2A, 2B, 2C, 2D, 2E illustrate examples of cMUT cells operating respectively as an emitter, or as a receiver, or as an emitter-receiver according to the invention, FIG. 3 illustrates an example of pulse operation of a cMUT transducer device according to the invention, FIG. 4 illustrates an example of transient operation of a cMUT transducer device according to the invention, FIG. 5 illustrates an example of permanent operation of a cMUT transducer device according to the invention, FIGS. 6A and 6B illustrate a membrane formed from a network of nanotubes in an example of a cMUT transducer according to the invention, where the membrane is represented respectively according to a top view and according to a transverse section view, FIGS. 7A and 7B illustrate a membrane of a cMUT transducer according to the invention, where the membrane is formed from a high-density network of nanotubes, and represented respectively according to a top view and according to a transverse section view, FIGS. 8A to 8D illustrate various arrangements of network(s) of nanotubes forming, or included in, a membrane of cMUT transducer devices according to the invention, FIGS. 9A to 9F illustrate various arrangements of network(s) of nanowires, or nanorods or nanotubes in a membrane of a cMUT transducer according to the invention, FIGS. 10A and 10B illustrate a membrane of a cMUT transducer formed from several layers of nanotubes aligned in different directions, according to a top view and according to a transverse section view, FIGS. 11A and 11B give examples of resonance frequency graphs of cMUT devices according to the invention including a membrane formed of nanotubes 1 μm in length and a membrane formed of nanotubes and 1 nm in radius, and obtained respectively using digital simulations for a membrane in air and in water, FIGS. 12A and 12B give examples of resonance frequency graphs of cMUT devices according to the invention including a membrane formed of nanotubes 1 nm in radius and a membrane of Young's module 1 TPa, and obtained respectively using measurements taken in air and in water, FIG. 13 illustrates an example of a cMUT transducer device according to the invention, including a hermetic cavity, FIG. 14 illustrates an example of a cavity of oblong shape in a cMUT transducer device according to the invention, FIG. 15 illustrates an example of a cMUT transducer device according to the invention, including several membranes facing the same cavity, FIG. 16 illustrates an example of a cMUT transducer device according to the invention, including one membrane facing several cavities, FIG. 17 illustrates an example of a cMUT transducer device according to the invention, including several membranes positioned one above the other and aligned in different directions.

Identical, similar or equivalent parts of the various figures have the same numerical references, to make it easier to go from one figure to another.

The various parts represented in the figures are not necessarily represented with a uniform scale, in order to make the figures more readable.

DETAILED ACCOUNT OF PARTICULAR EMBODIMENTS

An example of a device according to the invention, including at least one cMUT micro-manufactured ultrasonic transducer cell is given in FIGS. 1A and 1B (where FIG. 1A represents a transverse section view X'X of the device, whereas in FIG. 1B a top view of the device is given).

The cell includes at least one electrode 107 which may be metallic, for example gold-based, and which lies on a substrate 100, which may for example have a base of silicon or silicon oxide, and on which lie conducting zones 103*a*, 103*b*, which may play the role of an electric earth.

The cell also includes at least one membrane 105 (represented oscillating in FIG. 1A) the ends of which are connected to the zones 103*a*, 103*b*, in order to connect the membrane 105 to the earth.

Membrane 105 may be supported by blocks 104, for example having a base made of an insulating material such as $SiO_2$, on which blocks said membrane lies. The blocks 104 enable the membrane 105 to be held above a cavity 110 revealing the electrode 107, and in which the membrane 105 is intended to vibrate.

The depth (defined in a direction parallel to that of vector $\vec{k}$ of the orthogonal marker [O; $\vec{i}$; $\vec{j}$; $\vec{k}$] given in FIGS. 1A and 1B) of the cavity 110 may be, for example, of the order of 100 nm or, for example, between 100 nm and 1000 nm.

The cavity 110 may, for example, be rectangular or square in shape, the lateral dimensions of which (defined in a direction parallel to the plane [O; $\vec{i}$; $\vec{j}$] given in FIGS. 1A and 1B) may be of the order of 1 μm, or for example between 300 nm and 3 μm, and adjusted in order to optimise certain operating parameters of the device, such as the operational frequency, the vibrational amplitude of the membrane 105.

The membrane 105 may be formed from nanotubes, for example carbon nanotubes, or nanowires or nanorods, for example having a base of a semiconducting material such as Si, or for example having a base of a dielectric material such as $Si_3N_4$. The nanotubes, or nanowires, or nanorods, may be arranged in a single layer, or in several layers positioned one above the other.

The membrane 105 may be formed of juxtaposed rows of aligned nanowires or nanorods.

The nanotubes or nanowires or nanorods can be parallel to one another, enabling very strong lateral interactions of the Van der Waals type to be obtained.

A membrane formed of aligned and parallel nanowires or nanotubes may have a Young module which is much higher than that of a traditional membrane formed from a layer having a crystalline material base. In addition, due to the small diameter of these nanotubes, nanowires and nanorods the membrane formed in this manner has a thickness, of the order of one nanometer, smaller than that of a traditional membrane.

The nanowires or nanotubes or nanorods can be distributed over several layers or thicknesses.

By modifying the dispersion of the nanotubes around their average properties, for example their average radius, it is possible to modify the range of frequencies at which the membrane is intended to vibrate, and by the same token the bandwidth of the device.

Such a membrane also has as an advantage, in addition to its increased rigidity, the fact that its thickness is controllable, to an accuracy of a fraction of a nanometer.

The membrane may also be made hydrophilic or hydrophobic. This is facilitated notably when the membrane has a base of carbon nanotubes.

By modifying the type of nanotubes or nanowires or nanorods used it is possible to control certain physical parameters of the membrane, such as its density, stiffness or thickness.

The membrane 105 can include one or more sheets or layers called "connecting" sheets or layers, to enable the nanotubes or nanowires or nanorods to be connected, and possibly to provide sealing and/or to guarantee a degree of actuation efficiency of the membrane, without impairing its mechanical properties.

In the case, for example, in which the membrane 105 is formed from one or more layers of juxtaposed nanotubes, the "connecting" layer or layers can, for example, be in the form of one or more graphene layers.

The addition of one or more graphene layers to the nanotubes can enable the cohesion and sealing of the membrane to be improved, without impairing the movements of the membrane, due to the small number of sheets and the Young module of these layers, which is much lower than that of the nanotubes.

A connecting layer allowing greater sealing and cohesion of the membrane, having as its base a material other than graphene, may possibly be used.

The connecting layer (or connecting layers) may be designed with a base of a material which is more deformable than said nanotubes and/or nanowires and/or nanorods of the membrane.

For example, given an equal or roughly equal Young module, the connecting layer may be designed such that it has a moment of inertia at least five times lower than all the nanotubes and/or said nanowires and/or said nanorods of the membrane. According to another possibility, given an equal or roughly equal moment of inertia, the connecting layer may be designed such that it has a Young module at least five times lower than the assembly formed by the nanotubes and/or said nanowires and/or said nanorods.

The membrane 105 may be covered, in the regions surrounding the cavity 110, with metal zones 112*a*, 112*b*, for example having an aluminium base, lying on parts of the latter. The contact of the metal material of the zones 112*a*, 112*b*, to the membrane may be improved, for example by oxidation, for example by RIE treatment (where RIE stands for "reactive ion etching") or by functionalisation of the nanotubes, for example using COOH groups.

Such metal zones 112*a*, 112*b* can enable the membrane 105 to be attached to the edges of the cavity 110 in order to restrict energy losses and the reduction of operating frequencies relating to poor contact between the membrane and the support.

To generate a wave a DC polarisation voltage is applied, and also an AC voltage to electrode 107.

To detect an incident wave a DC polarisation voltage is applied to the membrane 105. The movements of a surrounding fluid then cause the membrane 105 to vibrate. These vibrations are detected by a variable capacity measurement between electrode 107 and membrane 105.

It is possible to use as a detection method, for example, a method such as that described in this article: "*Measurement of Nano-displacement based on in-plane suspended gate MOSFET detection compatible with a front-end CMOS process*" by E. Colinet et al. in 2008 IEEE Int. solid-state circuits conf, session 18, MOS MEDLEY, 18.2.

If an alternative voltage is imposed it is possible to detect variations of capacity in the emitting membrane 105 in order to determine the interferences between an emitted wave and a wave reflected by a target medium.

According to a variant of the example of cMUT cell which has just been described, it is also possible to implement a device with two very close cavities above which a single membrane 105 is positioned, or including a first cavity above which a first membrane is positioned, and a second cavity above which a second membrane is positioned, separate from the first membrane. In this case, a first cavity can be designed in order to produce the emitting part of the device, while a second cavity can be designed for the receiving part.

When both cavities are sufficiently close, separated for example by a distance d such that $d \ll \lambda$, the incident wave in the receiving cavity is identical to the incident wave in the emitting cavity, and easier to measure.

In FIGS. 2A-2E various examples of arrangements of cMUT cells and operating modes of these cells are given.

In FIG. 2A a cMUT transducer cell of the type described above in connection with FIGS. 1A and 1B is given. This cell operates as an acoustic wave emitter 200 and includes a membrane 105 intended to vibrate in a cavity 110 facing an electrode 107. The device is also fitted with means 210 to apply a variable potential Va to the electrode 107, and means 212 to apply a fixed potential Vs to the membrane 105.

In FIG. 2B a cMUT transducer cell of the type described above in connection with FIGS. 2A and 2B is also represented. The cell operates as an acoustic wave receiver 202 and includes a membrane 105, and means 212 to apply a fixed potential Vs to the electrode 107, and means 220 forming a capacitance meter, to measure a variation of capacity $\delta$Cm representative of the waves received by the membrane 105.

Another example of a cMUT cell is given in FIG. 2C. The cell operates as an emitter-receiver and includes a membrane 105 suspended above a first cavity 110 and a second cavity 170. The first cavity 110 belongs to the emitting part of the cell. The cell also includes means 210 to apply a variable potential Va to the membrane 105, and means 212 to apply a fixed potential Vs to the electrode 107. The second cavity 170, for its part, belongs to the receiving part of the cell. The cell also includes means 212 to apply a fixed potential Vs to a second electrode 207, and means 220 to measure a variation of capacity $\delta$Cm of the membrane 105, connected to the second electrode 207.

Another example of a cMUT cell is given in FIG. 2D. The cell operates as an emitter-receiver, and includes a membrane 105 and a single cavity 110 acting as both emitter and receiver. The cell also includes means 212 to apply a fixed potential Vs to an electrode 107, and means 220 to measure a variation of capacity $\delta$Cm of the membrane 105, connected to the electrode 107. Following the emission of acoustic waves 200, a measurement of the echo return time in the emitter enables a reflecting zone of the waves to be located, and the frequential analysis of these echoes enables the nature of the zones traversed by these waves to be identified.

Another example of a cMUT cell is given in FIG. 2E. The cell operates as an emitter-receiver and includes two membranes 105, 205 and two cavities 110, 270, where a first membrane 105 is intended to vibrate in the first cavity 110, a second membrane 205 is intended to vibrate in the second cavity 170, and the second membrane 205 is separate from the first membrane. In this case, the first cavity can be designed in order to produce the emitting part of the device, whereas a second cavity can be designed for the receiving part.

In either of the examples which have just been given the membrane or membranes are formed from one or more parallel layers of nanotubes and/or nanowires and/or nanorods.

Each of the cells can be associated with one or more modules integrated in the same support: for example, at least one amplification module, for example at least one memory module, for example at least one energy recovery module, for example data transmission and reception modules, for example at least one signal processing module suitable to accomplish operations such as, for example, Fourier decompositions or comparisons.

These modules can also possibly be positioned some distance from the cell, where the connection from the cell to this remote electronics can be accomplished by technologies such as "wire-bonding" or a TSV integration (TSV for "through-silicon vias").

A matrix of emitters or receivers or emitters/receivers as described above, and operated independently by an active matrixing system, based on transistors, can be produced.

By this means it is possible to form an imaging device of micrometric dimensions operating at ultra-high frequency, for example between 10 MHz and 10 GHz, in particular between 100 MHz and 200 MHz when the device is intended to operate in a liquid medium such as water or, for example, between 500 MHz and 5 GHz when the device is intended to operate in air.

In FIGS. 3, 4, 5, various operating modes of a cMUT cell are given.

When operating transiently a cMUT cell may have a pulse operating mode (FIG. 3) or a sinusoidal operating mode (FIG. 4).

In pulse mode (FIG. 3, using a voltage pulse (signal S1) applied to the emitter, the emitter can emit in its turn an acoustic wave in the form of a pulse (Signal S2), the temporal spread of which depends on the bandwidth of the emitter and of the surrounding medium. Pulse S2 is propagated in the medium and reaches the receiver at distance d after a period $T_1$ ($T_1$=d/$c_{fluid}$, where $c_{fluid}$ is the speed of sound in the medium). A frequential analysis of a signal S3 received and a comparison of it with emitted signal S2 allows the transfer function of the medium for the frequencies present in the spectrum of the emitter and of the receiver to be determined in a single operation. Pulse 52 can be partially reflected by the medium, leading to successive echoes in the receiver. The time for the echoes to return to the emitter enables the reflecting zone to be located, and the frequential analysis of them enables the nature of the interfaces traversed by pulse S2 to be analysed.

In sinusoidal mode (FIG. 4), the emitted wave may be in the form of a transient sinusoidal wave (signal S20), generated using a sinusoidal voltage (signal S10). A signal emitted between t=0 and t=T2 is received (signal S30) by the receiver at distance d between t=T1 and t=T2+T1. This is a sinusoid, the amplitude of which depends on ω, the pulse, in rad/s. The transfer function of the medium at frequency w is determined. Between t=0 and t=T3, where T3 is equal to several periods, the emitted wave depends on the region of space situated less than a few wavelengths from the emitter. Its emission amplitude between t=0 and t=T3 as a function of the frequency w enables a near-field acoustic impedance to be defined, which varies as a function of ω. In the emitter echo sinusoids interfere with the emitted wave. The amplitude and phase-shifting of these echoes enables the position and nature of the interfaces traversed by the wave to be deduced.

When operating permanently (FIG. 5), the emitter emits a wave (signal S200) of amplitude A at frequency w, for example around 1 GHz in air, and for example of the order of 100 MHz in water. The wave generated using a voltage S100 applied to the emitter is propagated in the medium and interferes with its echoes, causing transient properties. After a certain period, which depends on the medium and the speed of propagation of the waves in the medium, the wave attains a permanent regime. In the emitter and the receiver positioned at a distance d from the emitter, two sinusoids (respectively S200 and S300) are measured. In the emitter (signal S200), the amplitude and the phase-shifting of the reflected wave (which depends on the frequency) reflect the overall acoustic impedance of the surrounding medium. In the receiver (signal S300) this is the transfer function of the traversed medium.

Various examples of embodiments of a membrane of a cMUT transducer according to the invention will now be given.

The membrane 105 can be formed from a network of parallel and separate nanotubes (where the network is represented in FIGS. 6A and 6B, respectively according to a transverse section view and a top view).

The membrane 105 can be formed from a dense network of juxtaposed and mutually parallel nanotubes (where the network is represented in FIGS. 7A and 7B, respectively according to a transverse section view and a top view).

A dense membrane can be formed. The membrane is said to be "dense" when it is impermeable to the molecules of a fluid surrounding the transducer.

The limit of density depends on the fluid in question and on its interaction with the carbon atoms forming the membrane.

The limit of density may be, for example, such that a space of the order of 0.6 nm between two parallel nanotubes may be obtained for a membrane 105 of carbon nanotubes of a transducer device intended to operate in water.

The limit of density may also depend on physical characteristics such as the nanotubes dimensions, whether they are hydrophilic or hydrophobic in character, and the lateral interaction energy of the nanotubes forming the membrane.

Nanotubes distributed over several layers, for example over 3 layers, can enable the membrane 105 to be formed (FIG. 8A).

According to a possible implementation, the membrane of the transducer is formed from a first assembly of nanotubes of a first size, in particular of a first diameter, arranged in one or more layers 301, 302, 303, which are positioned vertically relative to one another, and a second assembly of nanotubes of a second size, in particular of a second diameter, arranged in one or more layers positioned vertically relative to one another 306, 307, 308, covering the first assembly (FIG. 8B).

In FIG. 8C, the membrane 105 is formed from a stack of layers 301, 302, 303, of nanotubes attached to a layer 320 known as the "connecting" layer, having a base of, for example, graphene, designed to connect the nanotubes and possibly to provide the membrane's seal. More particularly, the graphene connecting layer can enable the intervals between the neighbouring nanotubes of the layer of nanotubes supporting it to be covered, to form a flat structure.

Another example of implementation of the membrane 105 is given in FIG. 8D. In this example the membrane 105 is formed from a stack of layers 301, 302, 303 of nanotubes positioned between a first stack 322 of several connecting layers, having a base of, for example, graphene, and a second stack 332 of several connecting layers, having a base of, for example, graphene.

In a layer of nanotubes which are aligned but not contiguous, the density of the membrane depends on the spacing between the nanotubes. If this spacing is greater than the diameter of a nanotube, a deposit of one or more additional thickness(es) of nanotubes may be used to fill any free spaces between the nanotubes, and to increase the density of the membrane. The additional nanotubes are likely to be deposited naturally in the interstices between the nanotubes.

The thickness of the membrane depends on the number of layers of nanotubes or of connecting layers formed, and may be controlled very precisely, independently of the density and of the Young module.

The dispersion of the dimensions of the nanotubes around an average value can be controlled, and enables the bandwidth of frequencies at which the membrane is likely to vibrate to be adjusted.

If the membrane is formed from a network of nanotubes this network may be produced, for example, using a method of Langmuir Blodgett, as described in the document: *Langmuir Blodgett films of Single-Wall Carbon Nanotubes: Layer-by-layer deposition and in-plane orientation of nanotubes* Jpn. J. Appl. Phys. Vol. 42 (2003) pp. 7629-7634, or by dielectrophoresis, as in the document entitled: *Frequency Dependence of the structure and electrical behaviour of carbon nanotubes assembled by dielectrophoresis Nanotechnology* 16 (2005) 759-763.

The graphene sheets can be produced using the method described in *Synthesis of graphene based nanosheets via chemical reduction of exfoliated graphite oxide Carbon* 45 (2007) 1558-1565.

In this case, the network of nanotubes may be manufactured by a method such as the one described in the document: WO 2007/126412 A2. The sheets of graphene can be deposited, for example, by capillary dielectrophoresis on the network of nanotubes.

The natural affinity between nanotubes and graphene sheets enables the graphene sheet to be attached on to the nanotubes. It is also possible to envisage a deposit by dielectrophoresis or a surface functionalisation of a first sheet. After removing graphene sheets from the solution it is possible to deposit a network of nanotubes by dielectrophoresis on the graphene. After the graphene solution is rinsed off the process is repeated with a single-sheet graphene solution.

By this means it is possible to obtain a triple impermeable layer formed from a dense network of nanotubes positioned between two graphene sheets.

A structure including several layers of nanotubes may be produced, using several solutions of different compositions.

A dense membrane can be formed. The membrane is said to be "dense" when it is impermeable to the molecules of a fluid surrounding the transducer. The limit of density therefore depends on the fluid in question and on its interaction with the carbon atoms forming the membrane.

The lower limit of the distance between the nanotubes may be, for example, of the order of 0.6 nm for a membrane 105 of nanotubes of a transducer device intended to operate in water.

Since the equilibrium distance of nanotubes relative to one another is of the order of 0.35 nm, a membrane of nanotubes connected to one another by van der Waal interaction is impermeable to water molecules.

An example of a method for producing a cMUT transducer according to the invention will now be given.

On a substrate 100 the electrode 107 is produced, together with the zones 103*a*, 103*b* and the isolation blocks 104 forming the cavity 110, for example using lithography steps, for example using a beam of electrons of the "e-beam" type.

The layer on which the membrane 105 is formed may be functionalised by specific chemical groups, for example hydrophobic groups, or again aminated chemical groups, in order to increase the affinity of this layer for the nanotubes.

The membrane may be produced directly suspended above the cavity.

The membrane may be produced on a substrate without any cavities, where the cavity is produced, for example by HF engraving, for example after formation of the membrane.

The membrane 105 can also be positioned above a cavity by transfer, for example using a method commonly called "nano-imprint" on the substrate, whether or not functionalised.

It is possible to make a contact over the membrane by depositing a metal layer over the membrane 105, which is engraved to form metal zones 112*a*, 112*b* acting as zones for holding the membrane, and enabling the strength of the adhesion between membrane 105 and the membrane's support to be increased.

For the production of a matrix of cMUT cells, a functionalisation of the deposit zone may be accomplished for each of the cells. This method is an example of a self-assembly method, of the type, for example, such as those commonly called "patterned affinity templates".

The membrane 105 can be formed with mutually parallel nanotubes aligned in a given direction. The alignment of the nanotubes to form the membrane has several advantages compared to a membrane of unaligned nanotubes. The alignment allows a high density of nanotubes to be obtained for a small thickness of the membrane 105. Indeed, a single layer of unaligned nanotubes would contain empty spaces, which would have to be filled by adding additional layers of nanotubes, where the additional number of layers required is larger, the greater the disorder of the nanotubes.

A configuration with parallel nanotubes enables a membrane to be obtained with improved mechanical properties, and in particular greater rigidity and low thickness.

The interaction energy between two parallel nanotubes separated by a distance of the order of the equilibrium distance of the van der Waals interaction is much greater than the interaction between intersecting nanotubes, which enables an improved cohesion of the membrane to be obtained.

If the membrane 105 is formed solely with parallel nanotubes aligned in a given direction, the movement of the nanotubes is more uniform.

An organisation of the nanotubes into a network of parallel nanotubes enables a transducer to be obtained having an improved detection efficiency.

A membrane formed from aligned nanotubes enables the lateral cohesion of the membrane and its sealing to be increased, without reducing the rigidity of the membrane, and therefore its operating frequency.

Due to the high Young module of the nanotubes the membrane of the transducer formed from nanotubes has greater rigidity than that of the habitual membranes.

A broader range of usage frequencies, and in particular higher usage frequencies, can thus be obtained.

The controllable dispersion of the properties of the nanotubes around an average value enables a broadening of the bandwidth of the device which is favourable to its use in an electroacoustic transducer.

The variable number of the walls of the nanotubes enables the density of the membrane to be increased for a constant nanotube radius, and a quasi-constant Young module.

The thickness of the membrane depends on the number of layers of nanotubes or of graphene layers used, and may therefore be controlled very precisely, independently of the density and of the Young module.

The production of successive layers of nanotubes of carbon of different sizes can be obtained by changing only the solution used during the deposit.

The use of a transducer device according to the invention, with a carbon nanotube membrane, can be obtained without having to undertake a step of release of the membrane, which also reduces the number of technological steps, and allows a reduction of scale compared to the embodiments of transducers according to the prior art.

Due to its design, which can be qualified as "bottom-up", i.e. starting with an assembly of elements of nanoscale size, in order to form a functional final device of larger dimensions, the miniaturisation of the membrane is simplified: the elements constituting the membrane are structurally of micronic or nanoscale dimensions. Accordingly, the accessible resonance frequencies are higher than those of devices according to the prior art, due to the reduced dimensions of the cavity and of the properties of the materials.

In any of the examples of embodiment given above, membrane 105 has a low thickness, between for example 1 nm and 30 nm, depending on the number of layers of nanotubes or nanowires used.

The examples of membranes described above in connection with FIGS. 7A-7B and 8A-8D include carbon nanotubes arranged in one or more layers.

The membrane may be formed from a base of nanotubes of material(s) other than carbon, for example of electrically conducting nanotubes or nanotubes which are made electrically conducting, such as nanotubes made of boron nitride, possibly made conducting for example by doping or by functionalisation.

Non-metallic nanotubes can, possibly, be made conducting by doping or electro-plating or functionalisation.

According to other examples, the membrane or membranes of the cMUT transducer according to the invention can possibly be formed from parallel nanorods or nanowires of cylindrical or parallelepipedic shape, possibly connected by a connecting layer.

The membrane of a cMUT transducer according to the invention can, possibly, be formed from a mix of different nanotubes, or from a mix of different nanowires or from a mix of nanotubes and nanowires.

In FIG. 9A a membrane of cMUT transducer includes a core consisting of parallel nanowires 401, of cylindrical shape and covered by a connecting layer 420 designed to connect the nanowires.

It is possible that the nanowires can have been made conducting, and they can, for example, be semiconducting nanowires, for example having a silicon base, which may possibly be doped.

Connecting layer 420 designed to connect the nanowires can, for example, have a base of graphene.

In FIG. 9B a cMUT transducer membrane 105 is, for its part, formed from mutually parallel nanorods which are parallelepipedic in shape, where the nanorods are covered by a connecting layer 520 which can enable the nanowires to be connected, or the connection between the nanowires to be strengthened. The nanorods may have been produced, for example, by a technique called "nano-imprint lithography".

In FIG. 9C a cMUT transducer membrane 105 is formed from a layer of parallel nanotubes 301 covered by a connecting layer 420 designed to allow the nanowires to be connected, or to strengthen the connection between the nanowires.

In FIG. 9D the membrane 105 includes parallel rows 402 of aligned nanowires 401 covered by a connecting layer 420.

In FIG. 9E the membrane 105 includes parallel rows 502 of aligned nanorods 501 covered by a connecting layer 520.

In FIG. 9F the membrane 105 includes parallel rows 302 of aligned nanotubes 301 covered by a connecting layer 320.

The membrane 105 may be fitted with a self-supporting core consisting solely of nanowires and/or nanorods and/or nanotubes.

The nanowires or nanorods or nanotubes are, in the examples which have just been given, bars of critical dimension dc which may be between 0.5 nm and 5 μm (where the critical dimension dc is the smallest dimension of these "nanowires" or "nanorods", or "nanorods", excluding their thickness, and which is defined in the direction parallel to that of vector $\vec{i}$ of the orthogonal marker [O; $\vec{i}$; $\vec{j}$; $\vec{k}$] given in FIGS. 9A to 9F).

In the examples which have just been given the nanowires or nanorods or nanotubes have a length L (where the length L is the length defined in a direction parallel to that of vector $\vec{j}$ of the orthogonal marker [O; $\vec{i}$; $\vec{j}$; $\vec{k}$] given in FIGS. 9A to 9F), which may be between 50 nm and 1 mm.

Example embodiments of a cMUT transducer cell including one or more graphene-based layers, to connect and produce a sealing of networks of nanotubes, have been given. Other materials can be used to form such a layer or such layers, for example boron nitride.

The connecting layer of the nanotubes or nanowires likely to be used to form a cMUT transducer membrane may have a base of a crystalline material chosen to be more deformable than said nanotubes and/or nanowires and/or nanorods forming the membrane, and having, for example, an equal or roughly equal Young module, but a moment of inertia ten times less than that of the nanotubes and/or nanowires and/or nanorods, or having a Young module ten times less and a moment of inertia equal or roughly equal to that of the nanotubes and/or nanowires and/or nanorods.

Such a connecting layer can be produced, for example, by an ALD method (ALD for "atomic layer deposition"), which enables layers of very small thickness to be formed, for example of a thickness of between 5 Angströms and 5 nanometers.

The membrane can be given a hydrophilic or hydrophobic, according to the application intended for the cMUT transducer.

A membrane of carbon nanotubes can, for example, be made hydrophobic or hydrophilic with functionalised nanotubes.

The membrane can be treated in order to make it hydrophilic, for example using functionalised COOH groups on the nanotubes.

According to another possibility the membrane can be treated to make it hydrophobic, for example by electropolymerisation.

It is also possible to produce a hydrophilic or hydrophobic membrane directly, from nanotubes or nanowires which are themselves previously conditioned before assembly, for example by functionalisation of the nanotubes or again using a suitable coating formed on the nanotubes.

The size of an elementary cell of a cMUT transducer according to the invention is favourable to its incorporation in a matrix to form a miniaturised ultra-high-frequency acoustic imaging device or a very high resolution micro-sonar.

In the examples of cMUT transducers which have been given the cavity is rectangular in shape.

Cavities having other shapes: circular, or oval, or square, can also be envisaged.

A membrane formed from several superimposed layers of nanotubes or nanowires of different alignments between the layers can also be produced, particularly if the cavity is square in shape.

In FIGS. 10A and 10B an example of a membrane 105 formed from superimposed layers 610, 620, 630, 640 of nanotubes of different alignments between the layers is given (where FIG. 10A represents a top view of the membrane 105, while FIG. 10B gives a transverse section view of this membrane 105).

The membrane includes alternating layers 610, 630, the nanotubes 601*a* of which are aligned in a first direction, parallel to that of vector $\vec{i}$ of an orthogonal marker [O; $\vec{i}$; $\vec{j}$; $\vec{k}$] given in FIGS. 10A and 10B, and layers 620, 640, the nanotubes 601*b* of which are aligned in the second direction, parallel to that of vector $\vec{j}$ of the orthogonal marker [O; $\vec{i}$; $\vec{j}$; $\vec{k}$], orthogonal to the first direction.

These different alignments can be obtained for example, by dielectrophoresis using potentials applied successively to several sets of pairs of facing electrodes.

In FIGS. 11A and 11B examples of graphs C1 and C2 are given of resonance frequency as a function of the Young module of a transducer membrane according to the invention formed from carbon nanotubes 1 μm in length, and of radius 1 nanometer. Graph C1 is representative of measurements made in air, whereas graph C2 is representative of measurements made in water.

In FIGS. 12A and 12B examples of graphs C3 and C4 are given of resonance frequency as a function of the Young module of a transducer membrane according to the invention formed from carbon nanotubes of radius 1 nanometer and having a Young module of 1 TPa. Graph C3 is representative of measurements made in air, whereas graph C4 is representative of measurements made in water.

Various variants may be envisaged for the manufacture of a cMUT transducer according to the invention.

According to a first possibility it is possible to form the cavity 110 before forming the membrane 105. In this case, the membrane can then be produced directly on the support 100, or indeed produced outside the support 100, and can then be transferred to the support 100.

According to a second possibility it is possible to form a membrane 105 outside the support 100, then to transfer the membrane 105 to the support 100, and then form the cavity 110.

According to a third possibility, it is possible to form the membrane 105 on the support 100, and then to form the cavity 110.

An example of positioning of a cMUT cell including a membrane 105, formed above a hermetic cavity 770 is given in FIG. 13. In this example the cavity 770 is closed and demarcated by lateral walls 710*a*, 710*b*, 710*c*, 710*d*, which can be formed at least partially by blocks supporting the membrane 150, and by the membrane 150 itself and a support.

Such an arrangement can enable resonance modes, which depend on the height of the cavity, to be coupled to the modes of the membrane.

Such an arrangement can enable the quality factor and/or the vibrational amplitude to be increased, particularly in the device's bandwidth.

The production of a cMUT cell with one or more cavities which are not totally closed or hermetic, and in particular which have lateral openings, can enable evacuation of fluid through these openings, and prevent a damping of the displacements of the membrane, particularly in the case of frequencies different from the resonance modes, and which depend on the height of the cavity.

A cMUT cell with one or more cavities of oblong shape may be designed. A cavity 710 of oblong shape, with a length D, of the order of 2 to 1000 times the width d is, for example, represented in FIG. 14. This enables transverse spurious modes, which can be related to edge effects, to be prevented.

An example embodiment of a cMUT cell fitted with several electrodes, including an electrode for actuating the membrane and a read electrode, has already been given in connection with FIG. 2C.

According to other possible embodiments, cells fitted with several actuation electrodes and/or several read electrodes, which are independent, and each of which is positioned facing one or more membranes, can be designed. A matrix-based arrangement of the electrodes, including several rows of electrodes, can also be designed. With an arrangement including several electrodes positioned under a given cavity, it is possible to obtain an improved spatial reception sensitivity, possibly to experience displacements at different points of a membrane, and possibly to control the displacement of certain portions of the membrane independently.

Another example of a cMUT cell is given in FIG. 15. This device includes several membranes 205*a*, 205*b*, 205*c*, positioned above one or more cavities, and facing one or more actuation electrodes and/or one or more measuring electrodes.

This can enable improved evacuation of the fluid in which the membranes are intended to vibrate, and can limit the damping due to certain spurious modes. Such an arrangement can enable improved evacuation of the fluid, particularly when the cavity or cavities are closed laterally by lateral walls which prevent lateral evacuation of the fluid.

In a case, for example, in which the membranes 205*a*, 205*b*, 205*c* are positioned respectively above a first electrode, a second electrode and a third electrode, emission and reception by neighbouring membranes can be implemented.

An emission of waves which have been phase-shifted by neighbouring membranes can also be implemented, enabling a directivity and/or an emitted power to be obtained.

In a case in which the membranes 205*a*, 205*b*, 205*c* are positioned respectively above a first detection electrode, a second detection electrode and a third detection electrode, improved spatial reception sensitivity can be obtained.

Another example of a cMUT cell is given in FIG. 16. This device includes several cavities $\mathbf{710}_{11}$, $\mathbf{710}_{12}$, $\mathbf{710}_{13}$, $\mathbf{710}_{21}$, $\mathbf{710}_{22}$, $\mathbf{710}_{23}$, $\mathbf{710}_{31}$, $\mathbf{710}_{32}$, $\mathbf{710}_{33}$, arranged according in a matrix of several rows of cavities above which a membrane 150 is intended to vibrate.

Cavities of very small sizes, for example of a critical dimension or of width d between 50 nm and 500 nm can also be implemented.

The implementation of cavities of small size can notably enable high operating frequencies to be obtained, and also to make the production of a suspended membrane with a parallel nanotubes base easier.

According to a variant, a cell with cavities of different sizes can be implemented, and enable a given device to emit and/or receive according to different frequencies.

Examples of cells having cavities of rectangular shape were given above. Other shapes such as polygonal shapes, or hemispherical or spherical shapes, can also be designed for the cavities, notably depending on the power and/or directivity and/or amplitude and/or emission frequency and/or sensitivity and/or frequency of the reception frequency and/or reception bandwidth, which it is desired to obtain.

Another example of a cMUT cell is given in FIG. 17, and includes several membranes 705*a*, 705*b*, 705*c*, 705*d* of nanotubes, and electrodes $\mathbf{703}_1$, $\mathbf{703}_2$, $\mathbf{703}_3$, $\mathbf{703}_4$, $\mathbf{703}_5$, $\mathbf{703}_6$, $\mathbf{703}_7$, positioned on a support and aligned in different alignments, in pairs of electrodes facing one another.

A first membrane 705*a* is in contact with a first pair of electrodes $\mathbf{703}_1$, $\mathbf{703}_5$ positioned facing one another, whereas a second membrane 705*b* is in contact with a second pair of electrodes $\mathbf{703}_2$, $\mathbf{703}_6$ positioned facing one another, and a third membrane 705*c* is in contact with the third pair of electrodes $\mathbf{703}_3$, $\mathbf{703}_7$ positioned facing one another, and a fourth membrane 705*d* is in contact with a fourth pair of electrodes $703_4$, $703_8$. The membranes 705*a*, 705*b*, 705*c*, 705*d* thus have different alignments relative to one another.

In this example, all the electrodes are arranged so as to form a polygon, with one or more cavities inside the polygon, where each membrane of nanotubes is positioned with an angle different to that of the other membranes.

Such a positioning of electrodes, in pairs, and having different relative alignments, can be used to advantage to form membranes.

By applying a suitable voltage to a first pair of electrodes $703_1$ and $703_5$, positioned facing one another, it is possible to favour the deposit of a layer of nanotubes aligned according to a first alignment determined by the electrical field between the electrodes, in order to form the first membrane 703*a*.

Subsequently, by applying a suitable voltage to a second pair of electrodes $703_2$ and $703_6$, positioned facing one another, it is possible to favour the deposit of a layer of nanotubes aligned according to a second alignment determined by the electrical field between the electrodes $703_2$ and $703_6$, in order to form the first membrane 703*a*. This method is then continued, applying a voltage between the electrodes $703_3$ and $703_7$, to form the third membrane 703*c*, and then by applying a voltage between the electrodes $703_4$ and $703_8$, to form the fourth membrane 703*d*.

The invention claimed is:

1. A cMUT capacitive electroacoustic transducer comprising:

at least one membrane formed from one or more layers of nanotubes or nanowires or nanorods, said transducer being configured to produce ultrasonic acoustic waves by oscillating the membrane under effect of an electric field and being configured to detect ultrasonic acoustic waves by measuring a variation of capacity representative of the ultrasonic waves received by the membrane, wherein the membrane is further formed from at least one connecting Graphene layer attached to the nanotubes or nanowires or nanorods.

2. A cMUT capacitive electroacoustic transducer according to claim 1, wherein the one or more layers of nanotubes or nanowires or nanorods include at least one layer of parallel nanotubes, or nanowires, or nanorods.

3. A cMUT capacitive electroacoustic transducer according to claim 1, wherein the one or more layers of nanotubes or nanowires or nanorods includes a layer of parallel rows of aligned nanotubes, or nanowires, or nanorods.

4. A cMUT capacitive electroacoustic transducer according to claim 1, wherein said one or more layers of nanotubes or nanowires or nanorods includes a layer of nanotubes, or nanowires, or nanorods that are separated by a distance of an order of an equilibrium distance of van der Waals interaction.

5. A cMUT capacitive electroacoustic transducer according to claim 1, where the one or more layers of nanotubes or nanowires or nanorods includes:

one or more layers of nanotubes, or nanowires, or nanorods of a first critical dimension; and one or more layers of nanotubes, or nanowires, or nanorods of a second critical dimension, different from the first critical dimension.

6. A cMUT capacitive electroacoustic transducer according to claim 1, wherein the one or more layers of nanotubes or nanowires or nanorods includes at least a first layer of nanotubes, or nanowires, or nanorods aligned in a first direction, and at least a second layer of nanotubes, or nanowires, or nanorods aligned in a second direction, orthogonal to the first direction.

7. A cMUT capacitive electroacoustic transducer according to claim 1, further comprising:

at least one cavity above which a membrane is to oscillate.

8. A cMUT capacitive electroacoustic transducer according to claim 1, including at least one membrane, formed from one or more layers of nanotubes, or nanowires, or nanorods, said membrane being situated above plural cavities.

9. A cMUT capacitive electroacoustic transducer according to claim 1, including plural membranes, each formed from one or more layers of nanotubes, or nanowires, or nanorods, wherein the membranes are situated above a same cavity.

10. A cMUT capacitive electroacoustic transducer according to claim 6, wherein a membrane is situated above plural cavities or a matrix of cavities.

11. A cMUT capacitive electroacoustic transducer according to claim 1, including plural superimposed membranes each formed from one or more layers of nanotubes, or nanowires, or nanorods, wherein the membranes have different alignments.

12. A cMUT capacitive electroacoustic transducer according to claim 7, where one or more of the cavities is closed.

13. A cMUT capacitive electroacoustic transducer according to claim 1, further comprising:

at least one electrode which actuates the membrane, a polarization device to apply a fixed potential to the electrode, a polarization device to apply a variable potential to the electrode, a capacitance meter.

14. An acoustic imaging device or UHF sonar comprising a matrix of cMUT capacitive electroacoustic transducers according to claim 1.

15. A cMUT capacitive electroacoustic transducer according to claim 1, further comprising:

two metal members positioned over the at least one membrane and at opposite sides of the at least one cavity, the two metal members being configured to attach the cMUT capacitive electroacoustic transducer to a surface.

* * * * *